United States Patent
Wirtz et al.

(10) Patent No.: US 9,638,769 B2
(45) Date of Patent: May 2, 2017

(54) POSITION MARKER FOR USE IN AN MRI APPARATUS

(75) Inventors: Daniel Wirtz, Hamburg (DE); Christoph Leussler, Hamburg (DE); Sascha Krueger, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 582 days.

(21) Appl. No.: 14/233,811

(22) PCT Filed: Jul. 16, 2012

(86) PCT No.: PCT/IB2012/053621
§ 371 (c)(1),
(2), (4) Date: Jan. 20, 2014

(87) PCT Pub. No.: WO2013/011444
PCT Pub. Date: Jan. 24, 2013

(65) Prior Publication Data
US 2014/0159728 A1 Jun. 12, 2014

Related U.S. Application Data

(60) Provisional application No. 61/510,115, filed on Jul. 21, 2011.

(30) Foreign Application Priority Data

Jul. 21, 2011 (EP) ..................... 11174855

(51) Int. Cl.
*G01V 3/00* (2006.01)
*G01R 33/28* (2006.01)
*G01R 33/58* (2006.01)

(52) U.S. Cl.
CPC ........... *G01R 33/28* (2013.01); *G01R 33/287* (2013.01); *G01R 33/58* (2013.01)

(58) Field of Classification Search
USPC ....................................... 324/322
See application file for complete search history.

(56) References Cited

U.S. PATENT DOCUMENTS 5,331,550 A * 7/1994 Stafford ............... G06F 19/345
128/925
5,558,091 A * 9/1996 Acker .................. A61B 5/062
128/899

(Continued)

FOREIGN PATENT DOCUMENTS

EP 0768539 A2 4/1997
WO 2006025001 A1 3/2006

OTHER PUBLICATIONS

Coutts, Glyn, A. et al "Integrated and Interactive Position Tracking and Imaging of Interventional Tools and Internal Devices using Small Fiducial Receiver Coils", Magnetic Resonance in Medicine, vol. 40, 1998, pp. 908-913.

(Continued)

*Primary Examiner* — Rodney Fuller (57) ABSTRACT

A fiducial position marker (1) for use in a magnetic resonance (MR) imaging apparatus is disclosed for exciting and/or receiving MR signals in/from a local volume which at least substantially surrounds or adjoins the position marker, in order to determine and/or image from these MR signals the position of the position marker in an MR image of an examination object. Such a position marker (1) is especially used for determining and/or imaging a position of an interventional or non-interventional instrument to which the position marker may be attached, like a catheter, a surgical device, a biopsy needle, a pointer, a stent or another invasive or any non-invasive device in an MR image of an examination object. Further, a position marker system comprising such a position marker (1) and a circuit arrangement (5, 6, 6a, 8) for driving the position marker (1) for exciting (Continued)

MR signals and/or for processing MR signals received by the position marker is disclosed.

11 Claims, 5 Drawing Sheets

(56) References Cited

U.S. PATENT DOCUMENTS

| | | | |
|---|---|---|---|
| 5,727,552 A * | 3/1998 | Ryan | A61N 1/372 128/899 |
| 6,263,229 B1 | 7/2001 | Atalar | |
| 6,317,091 B1 | 11/2001 | Oppelt | |
| 6,574,497 B1 | 6/2003 | Pacetti | |
| 6,621,433 B1 * | 9/2003 | Hertz | G01R 33/3621 324/309 |
| 6,847,837 B1 | 1/2005 | Melzer | |
| 6,961,608 B2 | 11/2005 | Hoshino | |
| 7,239,400 B2 | 7/2007 | Bock | |
| 7,835,780 B1 * | 11/2010 | Duerk | G01R 33/287 600/410 |
| 8,798,715 B2 * | 8/2014 | Rapoport | A61B 5/02007 600/413 |
| 9,042,958 B2 * | 5/2015 | Karmarkar | A61B 5/0476 600/411 |
| 2008/0306376 A1 | 12/2008 | Hyde et al. | |
| 2011/0090394 A1 * | 4/2011 | Tian | H04N 19/63 348/424.1 |
| 2012/0081116 A1 * | 4/2012 | Takai | G01R 33/565 324/314 |
| 2014/0171784 A1 * | 6/2014 | Ooi | G01R 33/56509 600/414 |
| 2014/0266205 A1 * | 9/2014 | Vij | A61B 5/6852 324/322 |
| 2015/0035533 A1 * | 2/2015 | Lips | G01R 33/287 324/318 |

OTHER PUBLICATIONS

Dumoulin, C.L. et al Tracking of an Invasive Device within an MR Imaging System, ISMRM 1992, p. 104.

Kuehne, Titus, MD, et al "Pair of Resonant Fiducial Markers for Localization of Endovascular Catheters at all Catheter Orientations", Journal of Magnetic Resonance Imaging, vol. 17, No. 5, Jul. 2011, pp. 620-624.

Anderson, Kevan J.T. et al "Forward-Looking Intravascular Orthogonal-Solenoid Coil for Imaging and Guidance in Occlusive Arterial Disease", Magnetic Resonance in Medicine, vol. 60, No. 2, Aug. 2008, pp. 489-495.

Werner et al "MRI-Guided Breast Biopsy Using an Active Marker" Proc. Intl. Soc. Mag. Reson. Med. 11 (2004) p. 833.

* cited by examiner

POSITION MARKER FOR USE IN AN MRI APPARATUS

CROSS-REFERENCE TO PRIOR APPLICATIONS

This application is the U.S. National Phase application under 35 U.S.C. §371 of International Application No. PCT/IB2012/053621, filed on Jul. 16, 2012, which claims the benefit of U.S. Provisional Patent Application No. 61/510,115, filed on Jul. 21, 2011 and European Patent Application No. 11174855.4, filed on Jul. 21, 2011. These applications are hereby incorporated by reference herein.

FIELD OF THE INVENTION

The invention relates to a position marker for use in an MR imaging apparatus, for exciting and/or receiving MR signals in/from a local volume which at least substantially surrounds or adjoins the position marker, in order to determine and/or image from these MR signals the position of the position marker in an MR image of an examination object. Such a position marker is especially used for determining and/or imaging a position of an interventional or non-interventional instrument like a catheter, a surgical device, a biopsy needle, a pointer, a stent or another invasive or non-invasive device, as well as an RF surface coil, an RF pad coil, an RF head coil, a stereotactic frame or other instruments in an MR image of an examination object.

Further, the invention relates to a position marker system comprising such a position marker and a circuit arrangement for driving the position marker for exciting MR signals and/or for processing MR signals received by the position marker.

The invention also relates to an interventional or non-interventional instrument and an MR imaging apparatus, both comprising the above position marker or position marker system.

Finally, the invention relates to a method for imaging a current position of such an instrument or device or a part thereof in an MR image of an examination object by means of such a position marker.

BACKGROUND OF THE INVENTION

In an MRI apparatus (or an MR scanner), an examination object, usually a patient, is exposed within the examination space of the MRI apparatus to a uniform main magnetic field ($B_0$ field) so that the magnetic moments of the nuclei within the examination object tend to rotate around the axis of the applied $B_0$ field (Larmor precession) resulting in a certain net magnetization of all nuclei parallel to the $B_0$ field. The rate of precession is called Larmor frequency which is dependent on the specific physical characteristics of the involved nuclei and the strength of the applied $B_0$ field.

By transmitting an RF excitation pulse ($B_1$ field) which is orthogonal to the $B_0$ field, generated by means of an RF transmit antenna or coil, and matching the Larmor frequency of the nuclei of interest, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation pulse, the MR relaxation processes of the longitudinal and transversal components of the net magnetization begin, until the net magnetization has returned to its equilibrium state. The MR signals which are emitted during the relaxation processes, are detected by means of an RF/MR receive antenna or coil. The received MR signals which are time-based amplitude signals, are Fourier transformed to frequency-based MR spectrum signals and processed for generating an MR image of the nuclei of interest within an examination object.

In order to obtain a spatial selection of a slice or volume within the examination object and a spatial encoding of the received MR signals emanating from a slice or volume of interest, gradient magnetic fields are superimposed on the $B_0$ field, having the same direction as the $B_0$ field, but having gradients in the orthogonal x-, y- and z-directions. Due to the fact that the Larmor frequency is dependent on the strength of the magnetic field which is imposed on the nuclei, the Larmor frequency of the nuclei accordingly decreases along and with the decreasing gradient (and vice versa) of the total, superimposed $B_0$ field, so that by appropriately tuning the frequency of the transmitted RF excitation pulse (and by accordingly tuning the resonance frequency of the RF/MR receive antenna), and by accordingly controlling the gradient magnetic fields, a selection of nuclei within a slice at a certain location along each gradient in the x-, y- and z-direction, and by this, in total, within a certain voxel of the object can be obtained.

Interventional and non-interventional instruments and other medical devices as mentioned above are frequently used during the examination or treatment of an examination object and especially of a local zone or area thereof by means of an MR imaging apparatus. Such instruments or devices are for example catheters, biopsy needles, pointers and other which are used for example for biopsies, thermal ablations, brachytherapy, slice selection and other invasive or non-invasive purposes as mentioned above. Further, RF surface coils, RF pad coils, RF head coils, stereotactic frames and other instruments are also used during MR imaging. For all these and other examinations it is important to precisely position the instrument and especially a certain part thereof (like its tip) at a certain desired location at or within the examination object. This requires that during the positioning of the instrument, the current position of the instrument or an interesting part thereof, especially its tip, is precisely determined and imaged or indicated in the MR image of the related examination object, so that the desired destination at or within the examination object can be reached by an operator.

For this purpose, the above instruments or medical devices are usually equipped with a position marker which can be imaged by means of an MR imaging apparatus in the MR image of the related examination object.

Generally, two different types of such position markers can be distinguished, namely active and passive markers. Active markers as defined in this application are markers which are provided with a cable connection e.g. for being supplied with RF currents for transmitting a local RF excitation field for locally exciting MR signals in the vicinity of the marker, especially in a local volume which at least substantially surrounds or adjoins the marker, in order to detect and image this volume as the position of the marker in an MR image of an examination object, and/or for receiving a local MR signal from the vicinity of the marker, especially from a local volume which at least substantially surrounds or adjoins the marker, and for conveying it to the MR imaging apparatus in order to determine and image the position of the marker on the basis of the received local MR signal.

In the first case of transmitting a local RF excitation field, the resulting local MR signal in the vicinity of the active marker is received either by the marker itself and supplied to the MR imaging apparatus, or by an external (body- or surface-) coil of the MR imaging apparatus, both for determining the position of the marker and for generating a related position indication of the marker in the MR image of the examination object. In the second case of receiving a local MR signal by the marker, the required RF excitation field can be generated by the MR imaging apparatus or again by the marker itself.

Passive markers usually do not need an electrical connection to the MR imaging apparatus as active markers, but can be imaged in an MR image for example by distorting, enhancing or modifying due to their physical properties or due to an own (intrinsic) RF resonance (which is excited by the applied external RF excitation field), the $B_0$ field or the RF excitation field transmitted by the MR imaging apparatus and by this the MR signals emitted by the examination object.

Further, active and passive markers may include a marker material as an own signal source (e.g. fluorine-19), by which MR signals can be excited at a Larmor frequency which is different from the Larmor frequency of the examination object (usually water or fat), wherein by a first RF pulse sequence the position data of the marker material is determined and by a second RF pulse sequence the image data of the examination object is determined, and wherein both data sets are displayed in the form of a common MR image. All these principles enable a position determination and visualization of the active and passive marker, respectively, in connection with the applied gradient magnet fields within the MR image of an examination object.

WO 2006/025001 discloses an MR marker based position and orientation marking system for an interventional instrument, comprising at least three fiducial markers which generate MR signals responsive to an RF excitation generated by the related MR imaging scanner. The three fiducial markers are positioned at the corners of an equilateral triangle, providing a marker assembly which is rigidly connected with the interventional instrument. Each marker includes a small sealed vial containing a magnetic marker material like a fluorine containing material. The first marker includes a first coil having a coil normal oriented in a first direction. The second marker includes a second coil having a coil normal oriented in a second direction different from the first direction and being especially orthogonal to the first direction. These first and the second coil are connected in series to define a first channel and to generate a first quadrature MR receive signal which is connected with a first RF channel receiver. The third marker includes a third coil oriented in the same plane as the first coil of the first marker, however, the third coil is wound and connected with an opposite polarity in relation to the first coil. Further, the first marker includes a fourth coil which is oriented in the same plane as the second coil of the second marker but is wound and connected with an opposite polarity in relation to the second coil. The third and the fourth coil are connected in series to define a second channel and to generate a second quadrature MR receive signal which is connected with a second RF channel receiver. The first and the second quadrature MR receive signals are processed by a position/orientation processor for determining the position and orientation of the marker assembly and by this of the interventional instrument. Alternatively, each marker can be monitored by a separate MR receive channel, and the three received MR signals can be suitably processed to determine position and orientation of the intervention instrument.

In MRM 40: 908-913 (1998) "Integrated and interactive position tracking and imaging of interventional tools and internal devices using small fiducial receiver coils", by Glyn A., Coutts D., et. al., a method is described of tracking the position of a rigid device within an MR scanner and imaging with the image slice position determined by the current position of the device. The position tracking is performed by means of two or three small solenoid MR receiver coils. Each coil contains a small sample that acts as the fiducial MR visible marker point. The small receiver coils and fiducial assemblies are designed so as to produce sufficient SNR from a fiducial sample small enough to achieve the required localization accuracy while minimizing rotation of the bulk magnetization over the imaging region. The receiver coils are each connected with individual receiver channels comprising each a tune and match circuit and a coaxial transmission line which is short-circuited during transmission of the RF ($B_1$) excitation field by means of a PIN diode and thus behaves as an inductance. By appropriately adjusting the electrical length of the line, the resonant current induced in the receiver coil, and by this the field strength within the receiver coil, can be adjusted to a maximum value, so that the receiver coil can be employed as a local flux amplifier such that when the body magnetization is subject to a 1° rotation, the fiducial sample experiences a rotation several times this figure. If the solenoid receiver coil is oriented perpendicular to the $B_0$ field, the SNR is optimal.

U.S. Pat. No. 6,961,608 discloses an MR imaging system for MR imaging of an interventional device like a catheter, which is inserted into an object and which comprises an RF detection coil at its tip. Further, means for acquiring, together with the application of a gradient magnetic field to the RF detection coil, an MR signal from a vicinity of the RF detection coil excited by an RF magnetic field, and means for obtaining a position of the RF detection coil as the position of the tip through a frequency analyses of the MR signal are provided.

Further, ISMRM 1992, page 104, "Tracking of an Invasive Device within an MR imaging system", by C. L. Dumoulin, S. P. Souza and R. D. Darrow, discloses that a small RF coil is attached to an invasive device. The RF coil is a simple non-resonant loop with a diameter of smaller than 1 mm which is connected via a coaxial cable to a preamplifier. The RF coil detects MR signals from its immediate vicinity but is insensitive to MR signals coming from more than a few diameters away. By exciting RF relaxation signals in the examination object and generating gradient pulses, the location of the RF coil is determined.

In Proc. Intl. Soc. Mag. Reson. Med. 8 (2000) page 1307, "Active Marker of catheters for MRI guided interventions" by Toennissen et al., a marker comprising an LC resonance circuit for creating a local signal increase in the surrounding tissue is disclosed wherein the signal increase is detected by the related MR head coil and displayed in the MR image. The LC resonance circuit comprises a capacitive element and an inductive element in the form of a spiral coil, a flat coil and a meander coil.

Finally, U.S. Pat. No. 6,574,497 discloses an interventional device in the form of a guide-wire, a guiding catheter, a stent, a tube, a needle and other medical devices that incorporate a fluorine-19 containing material for use as a passive marker as explained above.

SUMMARY OF THE INVENTION

It has revealed that the accuracy of the determined position of the above and other markers is to a different degree dependent on a certain orientation and/or position of the marker in relation to the external main magnetic field ($B_0$ field) and/or the overall RF excitation field ($B_1$ field) which latter is generated by means of a whole body coil of the related MR imaging apparatus for exciting the MR (relaxation) signals within the examination object. This is disadvantageous because accordingly the above interventional or non-interventional instruments cannot be positioned exactly enough at a desired location at or within the examination object under all operating conditions.

An object underlying the invention is to solve this problem and especially to provide a position marker as explained above, the position of which can be determined and/or imaged in an MR image of an examination object more precisely and reliably and especially at least substantially independent of a certain orientation and/or position of the marker especially in relation to an external main magnetic field ($B_0$ field) and/or an overall RF excitation field ($B_1$ field) generated by an MR imaging apparatus.

Further, an object underlying the invention is to provide a method for determining and/or imaging a current position of an interventional or non-interventional instrument in the MR image of an examination object wherein the determined or imaged position is at least substantially independent especially of a certain orientation and/or position of the instrument especially in relation to an external main magnetic field ($B_0$ field) and/or an overall RF excitation field ($B_1$ field) generated by an MR imaging apparatus.

The above first object is solved according to claim 1 by a position marker for exciting and/or receiving MR signals in/from a local volume of an examination object, wherein the local volume at least partly surrounds or adjoins the position marker and wherein the position of the position marker is determined and/or imaged on the basis of these MR signals, wherein the position marker comprises at least a first and a second local RF coil each for locally exciting and/or locally receiving the said MR signals in/from the said local volume, wherein the first and the second RF coil each has a direction of main radiation/sensitivity, and wherein the RF coils are oriented such that these directions of main radiation/sensitivity are at least substantially orthogonal to each other.

Further, the above first object is solved by a position marker system according to claim 2.

The above second object is solved by a method according to claim 9.

Generally, a local volume in the sense of this application is considered to be such small that the position of the marker can be determined or imaged substantially with a spot-like extension which is small enough for obtaining a desired localization accuracy in the MR image of an examination object, but large enough that the MR signals which are excited in and/or received from the local volume enable a determination of the position of the position marker. Accordingly, the RF coils are local RF coils in the sense, that they only locally excite and/or only locally receive the said MR signals in/from the said local volume. In order to obtain this, the RF coils are small coils having accordingly small extensions as generally known in the art. Further, the RF coils are realized in a known manner such that they are resonant at the related MR frequency.

In case of an interventional instrument like a catheter which is introduced into an examination object, the local volume at least partly surrounds the position marker, whereas in case of a non-interventional instrument like an RF surface coil which is positioned on a surface of an examination object, the local volume adjoins the position marker.

The term "direction of main radiation/sensitivity" (or direction of principal radiation/sensitivity) is used in this application for indicating that the related RF coil has an increased radiation intensity and radiation sensitivity in a certain spatial direction in comparison to other spatial directions. Usually, such a certain spatial direction is called "lobe", and in case of more such directions especially "main lobe" and "side lobes" in the related antenna pattern (also called radiation pattern or spatial radiation characteristic). The at least two RF coils can have the same or different antenna patterns, and the directions of the main radiation can also be the same or different directions. Further, these directions can provide the same or different amounts of increase of radiation intensity or radiation sensitivity. The same accordingly applies in case of three RF coils.

Further, it is not relevant how many "directions of main radiation" each RF coil has and what the amount of the increase of the radiation intensity or radiation sensitivity actually is. It is only relevant, that one such direction of one RF coil is directed orthogonal to one such direction of the other RF coil. Accordingly, the polarity or winding direction of the RF coils is not relevant. Usually, each RF coil has one main direction, and preferably all RF coils have at least substantially the same direction of main radiation.

By the arrangement according to claim 1 the above explained dependency of the accuracy of the determined position of a marker especially on a certain orientation and/or position of the marker in relation to the external main magnetic field ($B_0$ field) and/or the overall RF excitation field ($B_1$ field) is considerably reduced.

As explained below in more details, the above principle of the invention is generally applicable in connection with all active and passive markers as mentioned in the introductory part above.

The dependent claims disclose advantageous embodiments of the position marker, the position marker system and the method, respectively.

It will be appreciated that features of the invention are susceptible to being combined in any combination without departing from the scope of the invention as defined by the accompanying claims.

Further details, features and advantages of the invention will become apparent from the following description of preferred and exemplary embodiments of the invention which are given with reference to the drawings.

DETAILED DESCRIPTION OF EMBODIMENTS

The following embodiments which are indicated in FIGS. 1 to 4 exemplarily explain the invention with reference to a position marker system which is provided for receiving MR signals from a local volume of an examination object and for selecting the appropriate MR signal, on the basis of which the position of the position marker is determined or imaged in a known manner especially by means of a known MR imaging apparatus. However, as explained further below, the position marker system can also be used for transmitting local RF signals for locally exciting MR signals in a local volume, which MR signals are received especially by a known RF whole body coil and evaluated for position determination of the local volume (and by this of the position marker) especially by means of a known MR imaging apparatus, wherein the appropriate RF coil of the position marker which is selected for transmitting the RF signal is selected according to the invention in an analogous manner as the selection of the appropriate MR signal from the MR signals which are received by the RF coils of the position marker.

Figure 1:
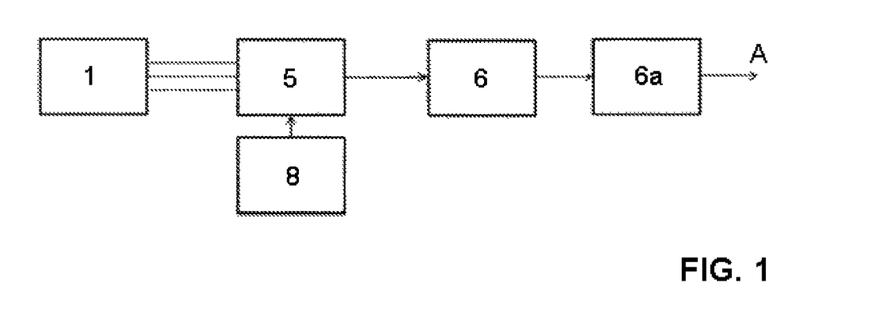
FIG. 1 shows a first embodiment of a position marker system according to the invention.

FIG. 1 shows a general configuration of a first embodiment of a position marker system according to the invention which substantially comprises a position marker 1, the output terminals of which are connected with input terminals of a diversity switch 5 which is controlled for example by means of a control unit 8. Preferably, an output terminal of the diversity switch 5 is connected with an input terminal of an analog to digital converter 6 for preferably converting the analog output signal of the diversity switch 5 into a digital MR output signal. Alternatively, the analog to digital converter 6 can also be integrated into the diversity switch 5 (see below).

Preferably, an electro-optical converter 6a is provided at the output terminal of the analog to digital converter 6 (or instead of the analog to digital converter 6) in order to generate a digital optical MR output signal at an output terminal A of the circuit arrangement. Again, this electro-optical converter 6a can also be integrated into the analog to digital converter 6, or the diversity switch 5 includes both converters 6, 6a for generating at its output terminal a digital optical MR output signal. The same accordingly applies for all other embodiments.

The MR output signal is transmitted (preferably via an optical fiber) to a known evaluation unit (not shown), which is especially a known MR imaging apparatus, for determining and/or imaging in a known manner the position of the position marker 1 in an MR image of an examination object.

According to a first alternative, the position marker 1 is arranged at an interventional or non-interventional instrument (not shown) at a location of this instrument, which is the interesting part to be imaged, for example its tip, which is to be guided to a certain desired destination area at or within an examination object. In this case, the determined position of the position marker is imaged in the MR image of the examination object.

If according to a second alternative, the position marker 1 is arranged at a location remote from the location of the interesting part of the instrument (e.g. at a grip thereof or another part which is rigidly connected with the interesting part), and assuming that both locations have a known spatial relationship to each other, the position of the interesting part of the instrument is calculated from the determined position of the position marker 1 and the said spatial relationship. In this case, the position of the position marker 1 is not imaged but only determined, and then the calculated position of the interesting part of the instrument is imaged by generating in the MR image of the examination object a related indicator, so that an operator can observe the motion of this indicator towards the destination area when he appropriately guides the instrument.

The position marker 1 preferably generates three different marker signals (MR signals), wherein each marker signal is supplied to the diversity switch 5 on each one of three output lines. Preferably, each one marker signal is generated by means of each one of the RF coils of the position marker as explained with reference to FIGS. 5 to 7. Consequently, the position marker 1 preferably comprises three coils, wherein these coils each have at least one direction of main radiation/sensitivity as explained above and are oriented such that these directions are orthogonal to each other.

It has revealed, that independent of a translational movement (i.e. a movement along a straight or curved motion path) and/or a rotational movement of the position marker 1 within the examination space of an MR imaging apparatus, always at least one of the three orthogonal RF coils receives (or excites in case of a position marker for exciting MR signals) an MR signal which has a sufficient signal strength or a sufficient signal to noise ratio for determining and/or imaging precise enough the position of the position marker within an MR image of an examination object, so that an operator can e.g. reliably guide an interventional or non-interventional instrument (which is provided with such a position marker 1) to a desired location or destination area at or within an examination object. For reaching certain (larger) destination areas it may even be sufficient when the position marker 1 comprises only two coils with each a direction of main radiation which are oriented orthogonal to each other in the sense above.

Generally, the above circuit arrangement which is connected with the position marker is provided for selecting and feeding to its output A always the one of the MR signals (supplied by the position marker 1) which has the highest signal strength and/or the highest signal to noise ratio, or which signal strength and/or signal to noise ratio exceeds a predetermined threshold value.

Accordingly, the diversity switch 5 comprises two or three input terminals for the position marker 1, one output terminal and one control terminal, with which the control unit 8 is connected.

According to this first embodiment, the diversity switch 5 and the control unit 8 are provided for comparing to each other the two or three marker signals (MR signals) at the input terminals of the diversity switch 5 with respect to their signal strength and/or signal to noise ratio and for selecting and supplying the one marker signal as an MR output signal to the output terminal of the diversity switch 5 which has the highest signal strength or—preferably—the highest signal to noise ratio.

Further, the diversity switch 5 and the control unit 8 are provided for repeating this comparing and selecting continuously or within predetermined time intervals and for selected another one of the received MR signals as the MR output signal if this has a higher signal strength and/or a higher signal to noise ratio than the presently selected MR output signal, so that always the one of the received MR signals is selected as MR output signal which has the highest signal strength and/or the highest signal to noise ratio of all received MR signals.

Alternatively, the signal strength and/or signal to noise ratio of the selected MR output signal can be compared with related predetermined threshold values. More in detail, if the signal strength and/or the signal to noise ratio of the selected MR output signal reaches of falls below a related threshold value, it is evaluated if any of the other MR signals has a higher signal strength and/or a higher signal to noise ratio which preferably exceeds the related threshold value. If such an MR signal is detected, it is selected as a new MR output signal, and the determination of the position of the position marker 1 is conducted on the basis of this new MR output signal as long as the MR output signal has a signal strength and/or the signal to noise ratio which is above or equal to the predetermined threshold value.

The threshold values are preferably predetermined such that if the signal strength or the signal to noise ratio reaches or falls below the related threshold value, a reliable determination or imaging of the position of the position marker is no longer ensured. Further, the above two alternatives can also be combined with one another.

Preferably, the diversity switch 5 also comprises an analog to digital converter and/or a FPGA device that allows the above processing of the MR signals within the diversity switch 5. Such an additional circuitry may especially conduct the digitization of raw data within the diversity switch 5. As a result, the specifications for the data link between the diversity switch 5 and the MR imaging apparatus or other hardware for determining and imaging the position of the marker 1 is significantly relaxed and may also be optical.

After transmission of the selected MR output signal (preferably via an optical fiber) as explained above e.g. to an MR imaging apparatus, the MR output signal is further analyzed especially with respect to its frequency in order to determine on the basis of the RF excitation field and the gradient magnet fields, generated by the related MR imaging apparatus, the position of the marker 1 in a known manner and to generate—if desired—a related indication of the marker 1 within the generated MR image of the examination object as explained above.

Figure 2:
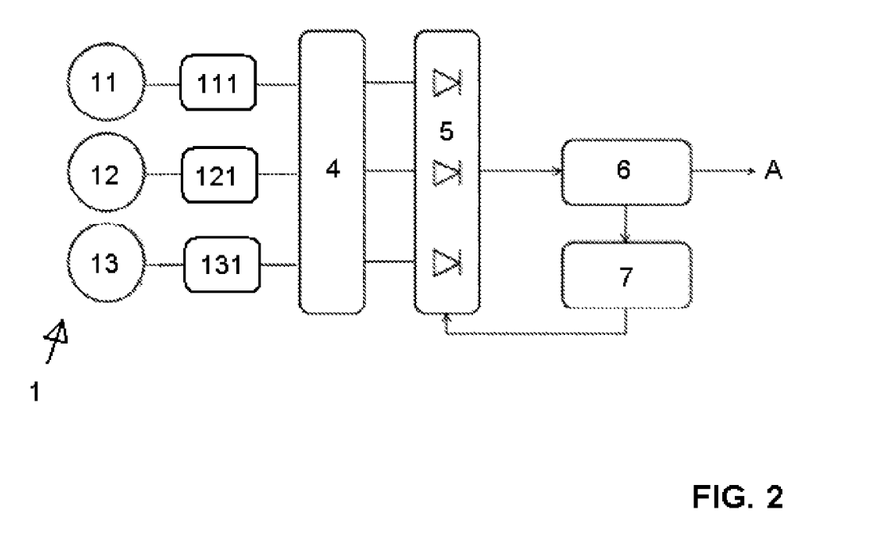
FIG. 2 shows a second embodiment of a position marker system according to the invention.

FIG. 2 shows a second embodiment of a position marker system according to the invention. The same or corresponding components as in FIG. 1 are denoted with the same or corresponding reference signs. Substantially, only the differences to the first embodiment shall be explained in the following.

The position marker 1 comprises a first, a second and a third RF coil 11, 12, 13 which each have a direction of main radiation/sensitivity and wherein the RF coils are oriented such that these directions are at least substantially orthogonal to each other as explained above.

Each RF coil 11; 12; 13 is connected with an input terminal of a related conventional tune and match circuit 111, 121, 131. These tune and match circuits are provided for tuning the RF coils to be resonant at the related RF/MR frequency of the examination object as generally known. Various different matching circuits may be applied, e.g. PI-matching, resonant matching and numerous other schemes. Typically, the RF coils are matched for lowest noise when used for receiving MR signals and proper impedance for power transfer when used for transmitting RF signals for exciting MR signals.

The output terminals of the tune and match circuits 111; 121; 131 are connected with the input terminals of a known optional decoupling unit 4 which is preferably provided in order to suppress any possible remaining couplings between the three coils 11; 12; 13 if necessary.

The output terminals of the decoupling unit 4 (or of the three tune and match circuits 111, 121, 131 if the decoupling unit 4 is omitted) are connected with input terminals of a diversity switch 5, wherein each one input terminal is provided for each one of the RF coils 11, 12, 13. One output terminal of the diversity switch 5 is connected with an input terminal of an analog to digital converter 6. The analog to digital converter 6 converts the analog output signal of the diversity switch 5 into a digital MR output signal, especially an optical MR output signal, which is transmitted via a first output terminal of the analog to digital converter 6 to further processing units, especially an MR imaging apparatus, for position determination. If desired, again an electro-optical converter (not shown) can be provided for converting the output signal of the analog to digital converter into an optical MR output signal.

Further, a driver unit 7 is provided, an input terminal of which is connected with a second output terminal of the analog to digital converter 6, and an output terminal of which is connected with a control input of the diversity switch 5 for controlling the same.

According to this second (and the following) embodiments, the analog to digital converter 6 is preferably provided not only for converting the analog MR signal at its input to a digital output signal, but also for evaluating the MR signal with respect to its signal strength and/or signal to noise ratio and for comparing at least one of these parameters with related predetermined threshold values as explained above. If one of these parameters reaches or falls below the related threshold value, a signal is submitted to the driver unit 7 such that it controls the diversity switch 5 for switching another one of the three analog MR signals to the input of the analog to digital converter 6. If this new MR signal exceeds the related threshold value, it is fed as the new MR output signal to the output terminal A of the circuit arrangement for position determination of the position marker 1. Otherwise, the next of the three analog MR signals is switched to the analog to digital converter 6 and compared with the threshold value, and so forth, until an MR signal is found which exceeds at least one of the threshold values, or which has the highest signal strength and/or the highest signal to noise ratio of the MR signals received by any of the RF coils of the position marker.

Figure 3:
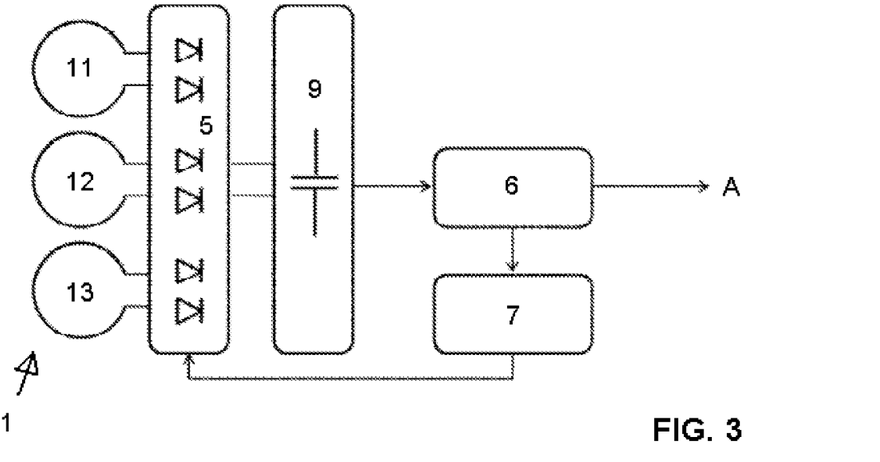
FIG. 3 shows a third embodiment of a position marker system according to the invention.

FIG. 3 shows a third embodiment of a position marker system according to the invention. The same or corresponding components as in FIGS. 1 and 2 are denoted with the same or corresponding reference signs. Substantially, only the differences to the second embodiment shall be explained in the following.

The position marker 1 again comprises a first, a second and a third RF coil 11, 12, 13 which are oriented as explained above.

The RF coils 11, 12, 13 are connected with a diversity switch 5 which is again controlled by means of an analog to digital converter 6 and a driver unit 7 as explained above. The output of the diversity switch 5 is connected with an input of a known tune and match circuit 9 for tuning and matching the one of the RF coils 11; 12; 13 which is connected by means of the diversity switch 5 with the input of the tune and match circuit 9. This embodiment has the advantage that only one tune and match circuit 9 is required in comparison to the second embodiment according to FIG. 2, which comprises each one tune and match circuit 111, 121, 131 for each RF coil, and that any couplings between the RF coils 11, 12, 13 can effectively be eliminated without an additional decoupling unit 4 as indicated in FIG. 2.

The output of the tune and match circuit 9 is connected with the input of the analog to digital converter 6 again for converting the analog MR signal to a digital MR output signal and for comparing the signal strength and/or the signal to noise ratio of the MR output signal with related predetermined threshold values as explained above. If the signal strength and/or the signal to noise ratio reaches or falls below the related predetermined threshold value, a related control signal is supplied to the driver unit 7 which controls the diversity switch 5 as explained above such that another one of the three RF coil output signals is connected with the output of the diversity switch 5, so that an MR output signal which exceeds the related threshold value (or which has the highest signal strength and/or the highest signal to noise ratio of the MR signals received by any of the RF coils) is supplied to the output terminal A of the circuit arrangement for position determination of the position marker.

Figure 4:
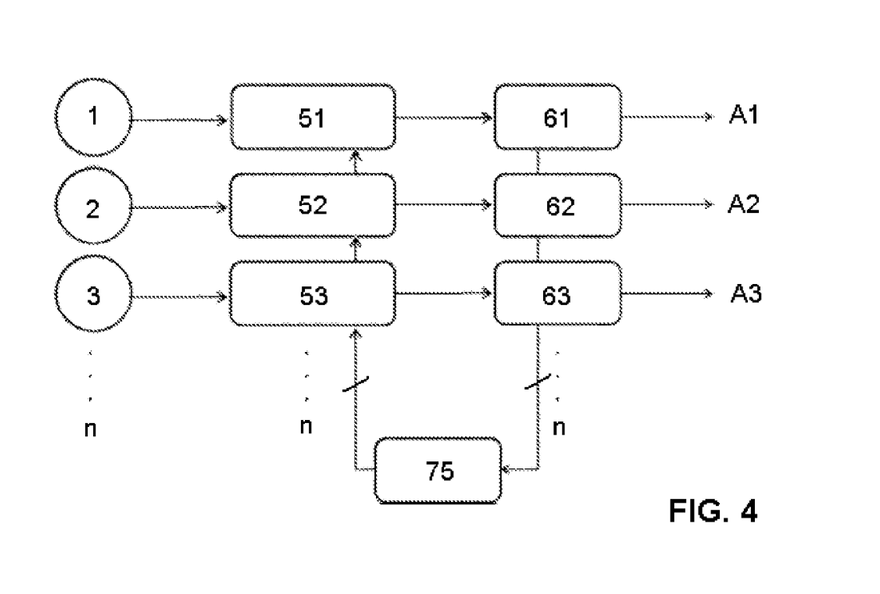
FIG. 4 shows a fourth embodiment of a position marker system according to the invention.

FIG. 4 shows a fourth embodiment of a position marker system according to the invention. This position marker system comprises a plurality of position markers 1, 2, 3, . . . n which each comprise preferably three (or only two) coils (not indicated) and comprise preferably each one tune and match circuit (not indicated) as explained above.

Each position marker 1, 2, 3, . . . n is connected with a diversity switch 51, 52, 53, . . . n, the output of which is each connected with each one analog to digital converter 61, 62, 63, . . . n. The analog to digital converters 61, 62, 63, . . . n are provided for controlling a common driver unit 75 which switches all diversity switches 51, 52, 53, . . . n, as explained above. Alternatively, each one driver unit can be provided for each one analog to digital converter 61, 62, 63, . . . n for controlling each one diversity switch 51, 52, 53, . . . n as explained above. The MR output signals A1, A2, . . . An of the analog to digital converters 61, 62, 63, . . . n can for example be transmitted by multiplexing via a common cable or optical fiber for further processing and determination and/or imaging the positions of the related position markers 1, 2, 3, . . . n as generally known and as explained above.

The above described circuit arrangements for evaluating and selecting the MR signals received by the related position marker is preferably realized in the form of an integrated circuit or chip which is arranged together with the related position marker on a common carrier which is provided for being attached at, or integrated into, an interventional or non-interventional instrument. Further, such a position marker system can also include a related small battery for supplying the circuit arrangement with electric power. In this case, only one connection line, especially in the form of an optical fiber is required for transmitting the selected MR output signal to an MR imaging apparatus for determining and/or imaging the position of the position marker. Alternatively, the required electric power can also be supplied to the circuit arrangement via an optical fiber and by means of a laser light source which latter is provided at the side of the MR imaging apparatus.

Figure 5:
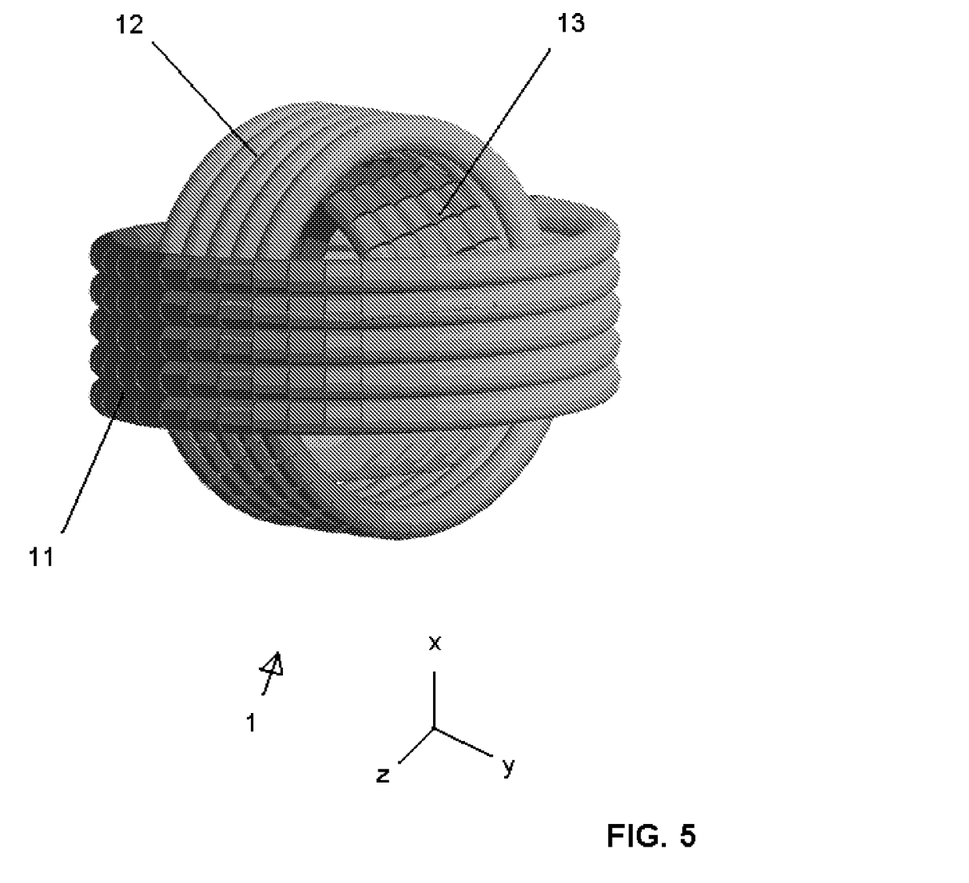
FIG. 5 shows a first embodiment of a position marker according to the invention.

FIG. 5 shows a first embodiment of a position marker 1 according to the invention. It comprises a first RF coil 11, a second RF coil 12 and a third RF coil 13. The RF coils are each substantially cylindrical coils comprising a number of windings in a known manner.

The cylindrical RF coils 11, 12, 13 have a direction of main radiation and sensitivity which extends along the axis of the cylinder (i.e. normal to the coil). The first RF coil 11 is oriented such that its direction of main radiation is directed along the x axis, the second RF coil 12 is oriented such that its direction of main radiation is directed along the y axis, and the third RF coil 13 is oriented such that its direction of main radiation is directed along the z axis, so that the three directions of main radiation are orthogonal to each other.

According to this embodiment, the first RF coil 11 encloses the second and the third RF coil 12, 13, and the second RF coil 12 encloses the third RF coil 13. By this, a very compact and small design can be obtained, and the local volume from which MR signals are received (or in which MR signals are excited) by the three RF coils is accordingly small, so that the position marker 1 enables the determination of a spot like position. Further, especially due to this close proximity of the three coils, the determined position is the same independent of the certain RF coil whose MR signal is selected as the MR output signal for position determination as explained above.

Figure 6:
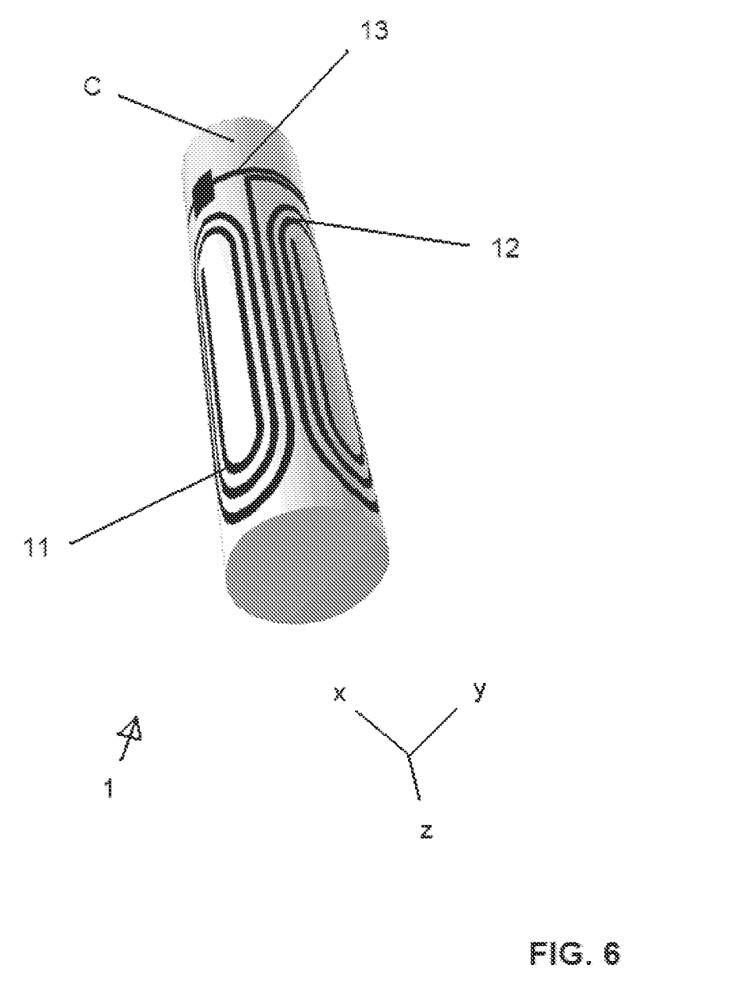
FIG. 6 shows a second embodiment of a position marker according to the invention and FIG. 7 shows a third embodiment of a position marker according to the invention.

FIG. 6 shows a second embodiment of a position marker 1 according to the invention. It comprises a first coil 11, a second coil 12 and a third coil 13, wherein the direction of main radiation/sensitivity of the first RF coil 11 is directed along the x axis, the direction of main radiation/sensitivity of the second RF coil 12 is directed along the y axis and the direction of main radiation/sensitivity of the third RF coil 13 is directed along the z axis.

The three RF coils 11, 12, 13 are PCB based coils which are applied in the form of a flat conductor structure or strip lines onto a surface of and/or within a body C of an interventional or non-interventional instrument or a part thereof, for example a section of a catheter or a rod. The first and the second RF coil 11, 12 extend e.g. in a longitudinal shape and along the longitudinal (axial) direction of the body C, whereas the third coil 13 is wound e.g. around the body C along its circumferential direction so that it extends in a plane perpendicular to the longitudinal axis of the body.

Figure 7:
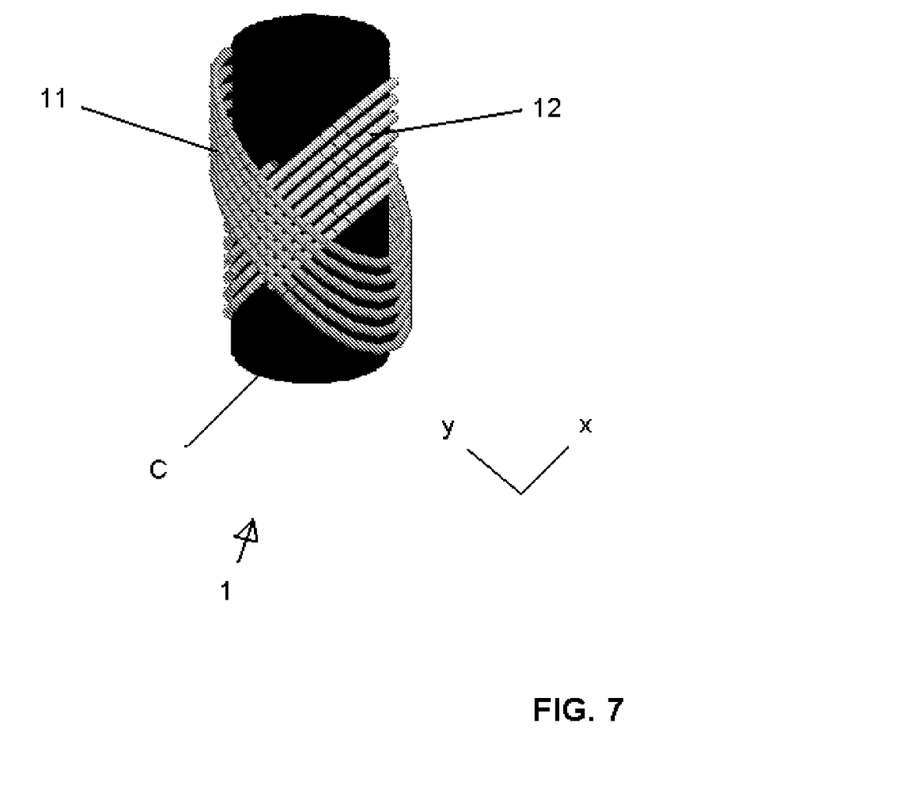

Finally, FIG. 7 shows a third embodiment of a position marker 1 according to the invention which comprises only two RF coils, namely a first RF coil 11 and a second RF coil 12, wherein the direction of main radiation/sensitivity of the first RF coil 11 is directed along the x axis and the direction of main radiation/sensitivity of the second RF coil 12 is directed along the y axis.

The two RF coils 11, 12 are either again PCB based coils which are applied in the form of a flat conductor structure onto a surface of a body C of an interventional or non-interventional instrument, for example a section of a catheter or a rod. Alternatively, the RF coils can be provided in the form of wires which are wound around the body C with an inclination in relation to the cross section of the body C (which extends perpendicularly to the axis of the body C).

Also other designs of RF coils can be used like for example butterfly, spiral, loop, meander, or saddle-like coil designs or combinations of all those coil designs as long as they have at least one direction of main radiation/sensitivity.

By orienting at least two and preferably three such RF coils as explained above, a reliable position determination and tracking of the position marker and by this of the related tip or other interesting part of an interventional or non interventional instrument is ensured in connection with the above MR signal evaluation, independent of a current translating, tilting or rotating movement or orientation of the instrument in relation to the RF excitation field or the static $B_0$ field within the examination space of the MR imaging apparatus.

Apart from the above interventional instruments, the position marker according to the invention can also be integrated with an RF surface coil. In this case, there is no need for aligning the RF surface coil and the examination object anymore.

Further, especially in case of using the position marker for exciting MR signals, marker materials like fluorine 19 can also be used which are e.g. enclosed by the RF coils of the position marker 1 and which have a Larmor frequency which is different from the Larmor frequency of the material of the examination object in order to determine the position of the position marker 1 as explained in the introductory part above. All this applies for all embodiments of the invention.

Further, passive markers as mentioned in the introductory part above can also be provided in the form of a position marker according to the invention. By this, a wireless position marker system can be provided which consists only of one or more position markers as explained above. A main advantage of such a passive marker is, that an MR safe navigation without the need for an RF cable can be provided.

However, a position marker system as explained above with reference to FIGS. 1 to 4 can also be provided with a transmitter unit for wirelessly transmitting the selected MR output signal to a receiver unit which is positioned remote from the position marker system at the MR imaging apparatus. In such a case, the diversity switch, the analog to digital converter and the transmitter unit can be provided in the form of an integrated circuit or chip together with the position marker at the related interventional device.

Further, instead of only receiving MR signals the RF coils of the position marker 1 can—additionally or alternatively— also be used as RF transmit coils for transmitting RF signals in order to excite MR signals in a local volume of the examination object surrounding or adjoining the position marker 1 which local volume can be made visible in the MR image as explained in the introductory part above, wherein after the excitation of the MR signals, these MR signals can be received subsequently by the RF coils of the position marker 1 or by the related whole body coil of the MR imaging apparatus.

In this case, a diversity switch is provided by means of which the one of the RF coils is selected for transmitting the RF excitation field, which results in MR signals having the highest strength and/or the highest signal to noise ratio of all RF coils.

More in details, the diversity switch is controlled by means of an evaluation unit which in a first step evaluates the MR signals successively received upon a sequential RF excitation by means of each one of the RF coils and compares these signals with each other with respect to their signal strength and/or their signal to noise ratio, and then in a second step controls the diversity switch such that the one RF coil of the position marker is selected for transmitting the RF excitation field which results in MR signals having the highest signal strength and/or the highest signal to noise ratio. If this signal strength or signal to noise ratio reaches or falls below a related predetermined threshold value, the above first and second step is repeated.

While the invention has been illustrated and described in detail in the drawings and foregoing description, such illustration and description are to be considered illustrative or exemplary and not restrictive, and the invention is not limited to the disclosed embodiments. Variations to embodiments of the invention described in the foregoing are possible without departing from the scope of the invention as defined by the accompanying claims.

The above principle of the invention can also be applied in case of transmitting RF signals by means of the position marker for locally exciting MR signal in the said local volume.

In this case, the RF signal to be transmitted by the position marker is input to the circuit arrangement, and the circuit arrangement is provided for driving the RF coils and for selecting from the RF coils of the position marker the one for transmitting the inputted RF signal, which excites an MR signal which has the highest signal strength and/or the highest signal to noise ratio of the MR signals excited by any of the RF coils by transmitting the RF signal.

For this purpose, preferably, any one of the RF coils of the position marker is selected and driven by the circuit arrangement for transmitting the RF signal, and this selection is maintained as long as the excited MR signal has a signal strength and/or the signal to noise ratio which is above or equal to a predetermined threshold value. If this signal strength and/or the signal to noise ratio reaches or falls below this threshold value, the circuit arrangement selects another one of the RF coils of the position marker for transmitting the input RF signal, which excites an MR signal which has a signal strength and/or a signal to noise ratio which exceeds the predetermined threshold value, or which excites an MR signal which has the highest signal strength and/or the highest signal to noise ratio of the MR signals excited by any of the RF coils. Then, the signal strength and/or the signal to noise ratio of the excited MR signal is monitored and compared with the threshold value and so on.

The MR signal excited by the related RF coil can be received by means of an RF antenna of the related MR imaging apparatus or by means of the position marker. The received MR signal can be compared with the threshold value in the related MR imaging apparatus or in the circuit arrangement.

The method for imaging the position marker or an interesting part of an interventional or non-interventional instrument is preferably conducted by a computer program which is run on a computer or a programmable microprocessor means which is a part of an MR imaging apparatus. Therefore, the computer program is preferably implemented in an MR imaging apparatus. If the MR imaging apparatus is provided with an interface to the Internet, the program is preferably adapted such that it can be downloaded to the MR imaging apparatus or one of its components when they are connected with the Internet. Otherwise, the computer program is stored on a computer usable medium and provided in the form of a computer program product for being installed in a computer or a programmable microprocessor means of an MR imaging apparatus in a known manner.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A system for use in a magnetic resonance MR imaging apparatus, the system comprising:
a position marker including at least first and second radio frequency (RF) coils having a direction of main radiation sensitivity oriented at least substantially orthogonal to each other for at least one of providing and receiving signals to and from a local volume in an examination object, the local volume at least partly surrounding or adjoining the position marker; and a circuit arrangement connected with the position marker and configured to:
  drive the at least first and second RF coils to transmit RF signals for exciting MR signals, and
  select at least one of the MR signals having a signal strength or a signal to noise ratio exceeding a predetermined threshold value, and having a highest signal strength or a highest signal to noise ratio of the MR signals.

2. The system according to claim 1, comprises a diversity switch connected to a control unit for comparing the signal strengths or the signal to noise ratios of the MR signals with each other or with the predetermined threshold value.

3. The system according to claim 1, further comprising a third RF coil having a direction of main radiation sensitivity, the first, second, and third RF coils are arranged such that their respective directions of main radiation sensitivity are at least substantially orthogonal to each other.

4. The system according to claim 3, wherein the first, second, and third RF coils are arranged on a common carrier.

5. The system according to claim 3, further comprising an instrument for including the position marker.

6. The system according to claim 5, wherein at least two RF coils of the first, second, and third RF coils comprise strip lines or wires applied onto a surface of the instrument or a part of the instrument.

7. The system according to claim 1, wherein the first RF coil at least substantially encloses the second RF coil.

8. In a magnetic resonance (MR) imaging apparatus, a method for imaging a position of an instrument in an examination object in which a position marker including at least first and second radio frequency (RF) coils having a direction of main radiation sensitivity oriented at least substantially orthogonal to each other for at least one of providing and receiving signals to and from a local volume in the examination object, the local volume at least partly surrounding or adjoining the position marker, the method comprising:

driving the at least first and second RF coils to transmit RF signals for exciting MR signals;
selecting one of the MR signals having at least one of a signal strength and a signal to noise ratio exceeding a predetermined threshold value, and having at least one of the highest signal strength and the highest signal to noise ratio of the MR signals,
determining a position of the position marker based on the selected MR signal and imaging a related position indication in the MR image of the examination object,
comparing the signal strength and/or the signal to noise ratio of the selected MR signal with the related predetermined threshold value and
repeating the acts of selecting and determining if the at least one of the signal strength and the signal to noise ratio of the selected MR signal is below the predetermined threshold value.

9. The method according to claim 8, further comprising an arranging the position marker at a remote location remote from a first location of a part of the instrument, wherein the remote and first locations have a known spatial relationship to one another, and wherein the determining comprises:
  determining the position of the position marker based on the selected MR signal,
  determining the position of the part of the instrument based on the determined position of the position marker and the known spatial relationship between the remote location of the position marker and the first location of the part of the instrument, and
  imaging a related position indication in the MR image at the determined position of the part.

10. A computer readable storage medium for storing software program code, executable on a programmable microprocessor, for executing the method of claim 8.

11. The method according to claim 10, wherein the computer program code is configured to be downloaded to an MR imaging apparatus or one of its components which comprise a programmable microprocessor for conducting a method the MR imaging apparatus being connected to an computer that is external to the MR imaging apparatus.

* * * * *